United States Patent
Zhan et al.

(10) Patent No.: US 10,559,604 B2
(45) Date of Patent: Feb. 11, 2020

(54) ARRAY SUBSTRATE, GATE DRIVING CIRCUIT AND DISPLAY PANEL

(71) Applicant: XIAMEN TIANMA MICRO-ELECTRONICS CO., LTD., Xiamen (CN)

(72) Inventors: Xiaojing Zhan, Xiamen (CN); Huangyao Wu, Xiamen (CN); Jinyuan Liao, Xiamen (CN); Changzhi Wu, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/219,960

(22) Filed: Dec. 14, 2018

(65) Prior Publication Data

US 2019/0123066 A1    Apr. 25, 2019

(30) Foreign Application Priority Data

Jun. 29, 2018    (CN) .......................... 2018 1 0717192

(51) Int. Cl.
*G09G 3/20*    (2006.01)
*H01L 27/12*    (2006.01)

(52) U.S. Cl.
CPC ............ *H01L 27/124* (2013.01); *G09G 3/20* (2013.01); *H01L 27/1218* (2013.01); *G09G 2300/0426* (2013.01); *G09G 2300/0452* (2013.01); *G09G 2310/0267* (2013.01)

(58) Field of Classification Search
None
See application file for complete search history.

(56) References Cited

U.S. PATENT DOCUMENTS

| | | | |
|---|---|---|---|
| 2009/0051636 A1* | 2/2009 | Natori | G09G 3/3648 345/87 |
| 2010/0026611 A1* | 2/2010 | Igeta | G02F 1/136286 345/55 |
| 2010/0053058 A1* | 3/2010 | Nagashima | G09G 3/36 345/98 |
| 2010/0060842 A1* | 3/2010 | Igeta | G02F 1/1339 349/153 |

(Continued)

FOREIGN PATENT DOCUMENTS

CN    106955237 A    7/2017

*Primary Examiner* — Kent W Chang
*Assistant Examiner* — Benjamin Morales
(74) *Attorney, Agent, or Firm* — Kilpatrick Townsend & Stockton, LLP

(57) ABSTRACT

An array substrate, a gate driving circuit and a display panel are provided. The array substrate includes a first display area, a second display area and an opening area. The opening area is surrounded by the first display area. Among the sub-pixels in the first display area, the sub-pixels in at least two adjacent columns are connected to a same first data line. Among the two sub-pixels in the same row electrically connected to the same first data line, one sub-pixel is connected to the first gate line, and the other sub-pixel is connected to the second gate line. For the sub-pixels in the second display area, the sub-pixels in different columns are connected to different second data lines, and the sub-pixels in different rows are connected to different gate lines.

17 Claims, 9 Drawing Sheets

(56) References Cited

U.S. PATENT DOCUMENTS

| | | | |
|---|---|---|---|
| 2016/0011633 A1* | 1/2016 | Watanabe | G02F 1/1333 345/184 |
| 2017/0154566 A1* | 6/2017 | Ryoo | G02F 1/13 |
| 2017/0162111 A1* | 6/2017 | Kang | G09G 3/3233 |
| 2017/0249896 A1* | 8/2017 | Kim | G09G 3/3225 |
| 2017/0261826 A1* | 9/2017 | Chen | G02F 1/13624 |
| 2017/0372661 A1* | 12/2017 | Gu | H01L 27/3276 |
| 2018/0190190 A1* | 7/2018 | Xi | G09G 3/3225 |

\* cited by examiner

ARRAY SUBSTRATE, GATE DRIVING CIRCUIT AND DISPLAY PANEL

CROSS REFERENCE TO RELATED APPLICATION

This application claims priority to Chinese Patent Application No. 201810717192.6, titled "ARRAY SUBSTRATE, GATE DRIVING CIRCUIT AND DISPLAY PANEL", filed on Jun. 29, 2018 with the Chinese Patent Office, which is incorporated herein by reference in its entirety.

FIELD

The present disclosure relates to the field of display, and particularly to an array substrate, a gate driving circuit and a display panel.

BACKGROUND

With the rapid development of display technology, display screens have been widely applied to various electronic devices, such as a mobile phone, a tablet and a television.

At present, "screen ratio" has become an important parameter for measuring the advantages and disadvantages of the display screens. The bezel of the display panel is narrowed with an increase of the screen ratio, and the full screen occurs accordingly. Since a front camera, a speaker, an indicator light, a sensor, and the like are arranged on the display screen, an opening should be formed in the display area of the full screen.

Generally, data lines corresponding to sub-pixels arranged around an opening on the display plane of the display screen should be arranged to bypass the opening. The number of lines bypassing the opening increases with an increase of the area of the opening, resulting in a large distance (the bezel) between the opening and the display area, which goes against the design concept of a narrow bezel.

In one embodiment, an array substrate is provided to reduce the width of the bezel between the opening and the display area.

SUMMARY

In view of this, an array substrate, a gate driving circuit and a display panel are provided in the present disclosure, to reduce the width of the bezel between the opening and the display area.

An array substrate is provided, which includes a display area and a non-display area, multiple gate line groups and multiple first data lines, and multiple gate lines and multiple second data lines.

The display area includes a first display area and a second display area, and the non-display area includes a first non-display area and a second non-display area. The display area is surrounded by the first non-display area, the second non-display area includes an opening area, and the opening area is surrounded by the first display area.

The multiple gate line groups and multiple first data lines are arranged in the first display area. Each of the gate line group includes a first gate line and a second gate line, and the multiple gate line groups intersect with the first data lines to define multiple sub-pixels arranged in an array. The sub pixels in at least two adjacent columns are connected to a same first data lines. Among the two sub-pixels in a same row electrically connected to a same first data line, one sub-pixel is connected to the first gate line, and the other sub-pixels is connected to the second gate line.

The multiple gate lines and the multiple second data lines are arranged in the second display area. The multiple gate lines intersect with the second data lines to define multiple sub-pixels arranged in an array. The sub-pixels in the same column are connected to a same second data line, and the sub-pixels in different columns are connected to different second data lines. The sub-pixels in the same row are connected to a same gate line, and the sub-pixels in different rows are connected to different gate lines.

A gate driving circuit applied to the above array substrate is provided, which includes multiple cascaded first gate driving circuits and multiple cascaded second gate driving circuits.

Each of the multiple cascaded first gate driving circuits includes at least two gate signal output terminals. For each of the gate driving circuits, one of the gate signal output terminals is connected to one of the first gate lines arranged in the first display area, and the other of the gate signal output terminals is connected to one of the second gate lines arranged in the first display area.

The second gate driving circuit includes a gate signal output terminal, and the gate signal output terminal is connected to one of the gate lines arranged in the second display area.

A gate driving circuit applied to the above array substrate is provided, which includes a first gate driving circuit group arranged on one side of the display area and a second gate driving circuit group arranged on the other side of the display area. The first gate driving circuit group includes multiple cascaded third gate driving circuits and multiple cascaded fourth gate driving circuits, and the second gate driving circuit group includes multiple cascaded fifth gate driving circuits and multiple cascaded sixth gate driving circuits.

Each of the third gate driving circuits and the fourth gate driving circuits includes a gate signal output terminal, the gate signal output terminal of each of the third gate driving circuits is connected to one of the first gate lines arranged in the first display area, and the gate signal output terminals of the multiple fourth gate driving circuits are connected to a part of the gate lines arranged in the second display area.

Each of the fifth gate driving circuits and the sixth gate driving circuits includes a gate signal output terminal, the gate signal output terminal of each of the fifth gate driving circuits is connected to one of the second gate lines arranged in the first display area, and the gate signal output terminals of the sixth gate driving circuits are connected to a part of the gate lines arranged in the second display area.

A gate driving circuit applied to the above array substrate is further provided, which includes a third gate driving circuit group arranged on one side of the display area and a fourth gate driving circuit group arranged on the other side of the display area. The third gate driving circuit group includes multiple cascaded seventh gate driving circuits, and the fourth gate driving circuit group includes multiple cascaded eighth gate driving circuits.

Among the sub-pixels arranged in the same row in the first display area, the gate line connected to the sub-pixel arranged on one side of the opening area is connected to an output terminal of the seventh gate driving circuit, and the gate line connected to the sub-pixel arranged on the other side of the opening area is connected to an output terminal of the eighth gate driving circuit.

A display panel is provided, which includes the above array substrate.

An array substrate according to the present disclosure includes a display area and a non-display area. The display area includes a first display area and a second display area, and the non-display area includes a first non-display area and a second non-display area. The display area is surrounded by the first non-display area, and the second non-display area includes a wiring area and an opening area. The opening area is surrounded by the first display area. Multiple gate line groups and multiple first data lines are arranged in the first display area. Each of the gate line groups includes a first gate line and a second gate line. The multiple gate line groups intersect with the first data lines to define multiple sub-pixels arranged in an array. The sub-pixels in at least two adjacent columns are connected to a same first data line. Among two sub-pixels in the same row electrically connected to the same first data line, one sub-pixel is connected to the first gate line, and the other sub-pixel is connected to the second gate line. Multiple gate lines and multiple second data lines are arranged in the second display area, and the multiple gate lines intersect with the second data lines to define multiple sub-pixels arranged in an array. The sub-pixels in the same column are connected to the same second data line, and the sub-pixels in different columns are connected to different second data lines. The sub-pixels in the same row are all connected to the same gate line, and the sub-pixels in different rows are connected to different gate lines.

It can be seen that, in this solution, the sub-pixels in the first display area surrounding the opening area are connected with two gate lines, to reduce the number of the used first data lines, and further reduce the number of lines bypassing the opening area, thereby decreasing the width of a bezel between the opening area and the first display area.

In addition, since the number of data lines in the first display area is reduced, the number of the data lines bypassing the opening area arranged in the wiring area is reduced, and a line distance between two adjacent data lines may be increased, thereby reducing coupling capacitance between the two adjacent data lines.

BRIEF DESCRIPTION OF THE DRAWINGS

Embodiments of the present disclosure will be shown in the drawings and the following description.

DETAILED DESCRIPTION

In the following, embodiments of the present disclosure will be clearly and completely described in conjunction with drawings in the embodiments of the present disclosure. Apparently, the described embodiments are a part rather than all of the embodiments of the present disclosure.

Figure 1:
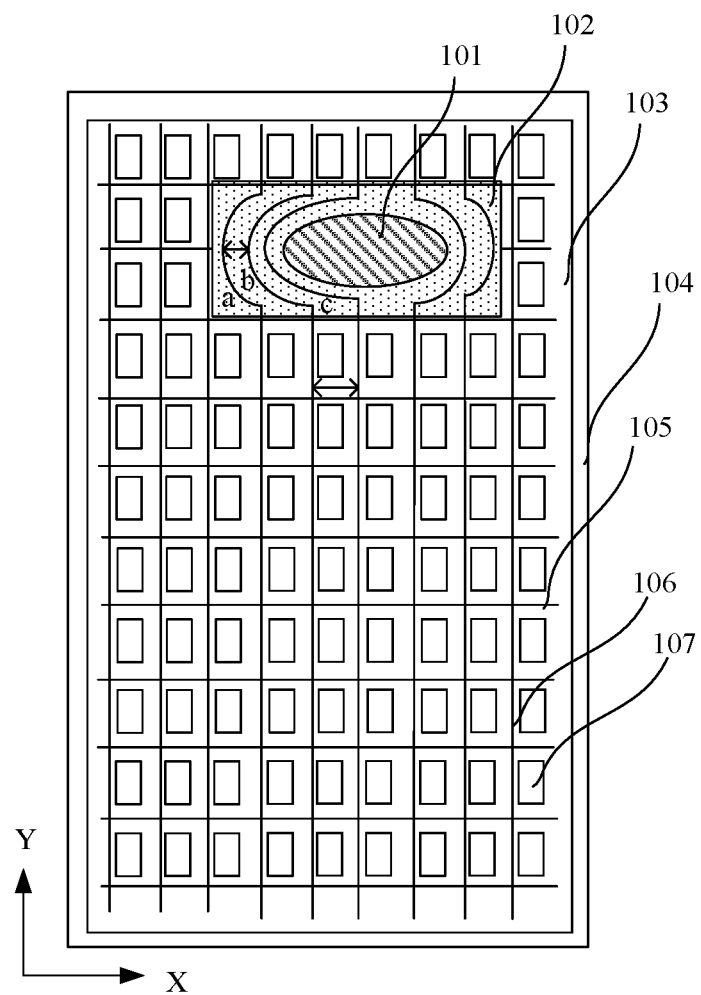
FIG. 1 is a schematic structural diagram of a full screen in the conventional technology.

Referring to FIG. 1, which is a schematic structural diagram of a full screen in the conventional technology, The full screen includes an opening area 101, a wiring area 102 surrounding the opening area 101, a display area 103 surrounding the wiring area 102, and a non-display area 104 surrounding the display area 103. In addition, the full screen further includes multiple gate lines 105 and multiple data lines 106 arranged in the display area 103. The multiple gate lines 105 intersect with the multiple data lines 106 to define multiple sub-pixels 107 arranged in an array.

In the full screen, each of the gate lines 105 extends along a row direction X of a pixel array, and each of the data lines 106 extends along a column direction Y of the pixel array. Each of the sub-pixels 107 is electrically connected to one gate line 105 and one data line 106 corresponding to the sub-pixel. An electronic device such as a camera or a speaker may be arranged in the opening area 101.

It is found that since the full screen has an opening area 101, the data line connected to the sub-pixel arranged below the opening area 101 needs to bypass the opening area 101 to pass through the wiring area 102, as shown by the bending lines a, b, and c arranged in the wiring area 102 in FIG. 1. The number of lines bypassing the opening area 101 increases with an increase in the area of the opening area 101, resulting in a wide bezel between the opening area 101 and the display area 103, which goes against the design concept of a narrow bezel.

Moreover, the bezel between the opening area 101 and the display area 103 is narrow in design for the narrow bezel, in this case, a line distance between the data lines arranged in the wiring area 102 is much smaller than a line distance between the adjacent data lines arranged in the display area 103.

$$C = \frac{\varepsilon S}{4\pi k d}$$

It can be known according to the capacitance calculation formula that the capacitance is inversely proportional to the distance when other parameters remain unchanged. Therefore, coupling capacitance between adjacent data lines arranged in the wiring area is much larger than coupling capacitance between adjacent data lines arranged in the display area.

Due to the coupling capacitance between adjacent data lines, when data signals are transmitted in data lines, crosstalk occurs between the adjacent data lines, and the signal in the data line is abnormal, such that a voltage of the signal transmitted to the sub-pixel is different from a preset voltage value, and a problem of display unevenness of picture occurs.

Figure 2:
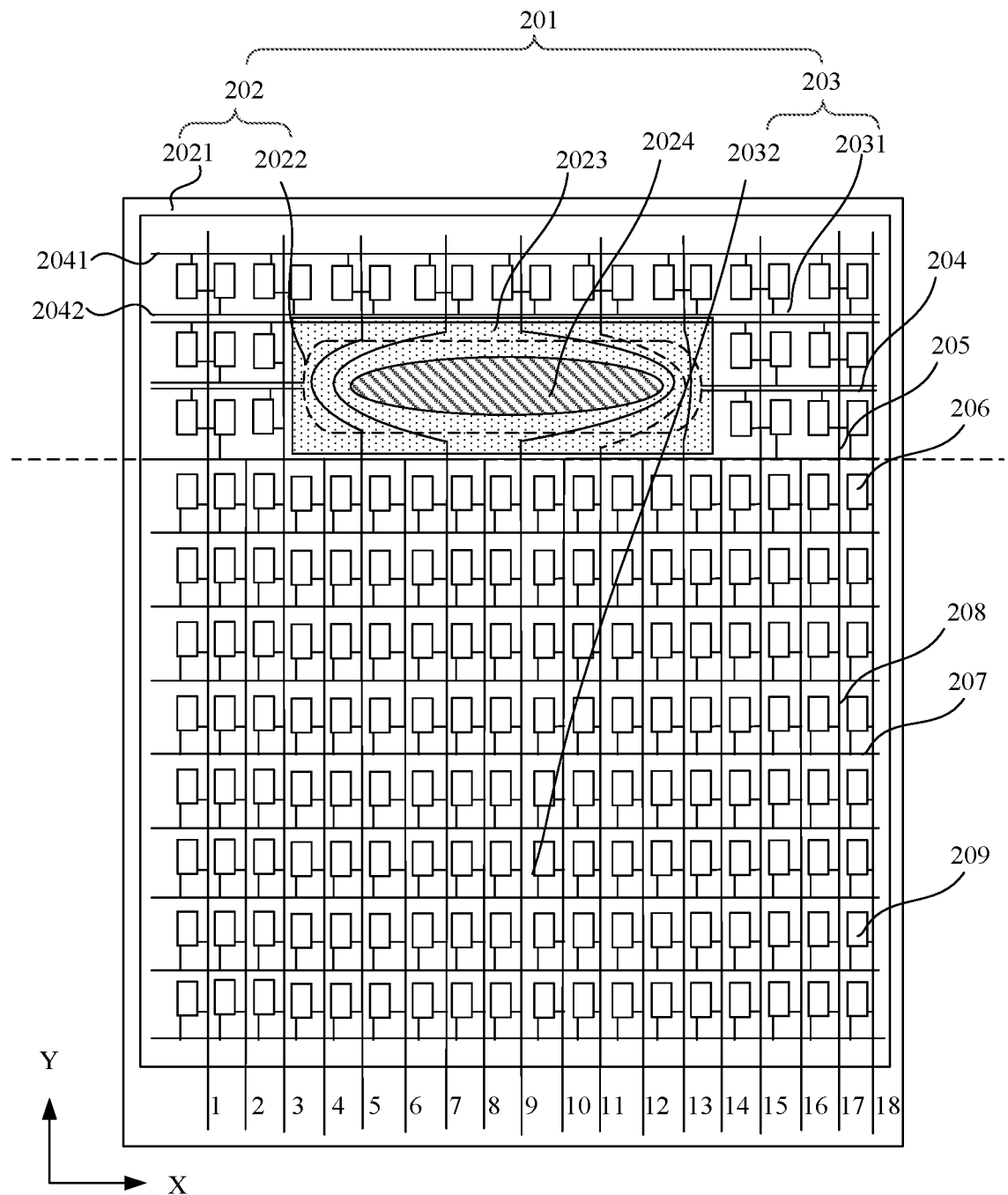
FIG. 2 is a schematic structural diagram of an array substrate according to an embodiment of the present disclosure.

Based on this, as shown in FIG. 2, which is a schematic structural diagram of an array substrate according to an embodiment of the present disclosure, with the array substrate according to an embodiment of the present disclosure, coupling capacitance between adjacent data lines is reduced while reducing the width of a bezel between an opening and a display area. The array substrate includes a substrate 201.

The substrate 201 includes a non-display area 202 and a display area 203. The non-display area 202 includes a first non-display area 2021 and a second non-display area 2022. The display area 203 includes a first display area 2031 and a second display area 2032. The second non-display area 2022 includes a wiring area 2023 and an opening area 2024.

The first non-display area 2021 surrounds the display area 203, the first display area 2031 surrounds the wiring area 2023, and the wiring area 2023 surrounds the opening area 2024. It should be illustrated that, in this embodiment, the opening area 2024 may be a through hole formed in the second non-display area 2022 and extending through the array substrate along a thickness direction, or may be a blind hole on the array substrate formed by only removing a part of a predetermined film layer while remaining a substrate (e.g., a glass substrate) of the array substrate.

Multiple gate line groups 204 and multiple first data lines 205 are arranged in the first display area 2031, and the gate line group includes a first gate line 2041 and a second gate line 2042. The multiple gate line groups 204 intersect with the first data lines 205 to define multiple sub-pixels 206 arranged in an array. The sub-pixels in at least two adjacent columns are connected to the same first data line. For example, in FIG. 2, the sub-pixels in the first column and the sub-pixels in the second column are connected to the data line 1 in the first display area. For another example, the sub-pixels in the third column and the sub-pixels in the fourth column are connected to the data line 3 in the first display area. Among two sub-pixels in the same row electrically connected to the same first data line, one sub-pixel is connected to the first gate line 2041, and the other sub-pixel is connected to the second gate line 2042.

The multiple gate lines 207 and multiple second data lines 208 are arranged in the second display area 2032. The multiple gate lines 207 intersect with the second data lines 208 to define multiple sub-pixels 209 arranged in an array. The sub-pixels in the same column are connected to the same second data line, and the sub-pixels in different columns are connected to different second data lines. The sub-pixels in the same row are connected to the same gate line, and the sub-pixels in different rows are connected to different gate lines.

It can be seen that, in this solution, the sub-pixels in the first display area surrounding the opening area are connected to two gate lines, such that the number of data lines bypassing the opening and arranged in the wiring area is halved, that is, the number of the used first data lines is reduced. In a case that a distance between adjacent data lines bypassing the opening is the same as a line distance between adjacent data lines in the second display area, the width of a bezel between the opening area and the first display area is halved.

In addition, since the number of data lines in the first display area is reduced, the number of the data lines bypassing the opening arranged in the wiring area is reduced, and a line distance between two adjacent data lines may be increased, thereby reducing the coupling capacitance between the two adjacent data lines.

Referring to FIG. 2, in the array substrate, among the sub-pixels arranged in the first display area, the sub-pixels in an odd column and the sub-pixels in an even column adjacent to the odd column are connected to the same first data line, and the sub-pixels in different odd columns are connected to different first data lines. Among the sub-pixels in the same row, the sub-pixels arranged in an odd column are connected to the first gate line, and the sub-pixels arranged in an even column are connected to the second gate line.

For example, the sub-pixels in a first column and the sub-pixels in a second column are connected to the data line 1, and the sub-pixels in a third column and the sub-pixels in a fourth column are connected to the data line 3.

In this embodiment, the sub-pixels in two adjacent columns are connected to the same data line in multiple arrangement manners. As shown in FIG. 2, for the sub-pixels in two columns connected to the same first data line, the sub-pixels in one column are arranged on one side of the first data line, and the sub-pixels in the other column are arranged on the other side of the first data line. That is, the data line 1 is arranged between the sub-pixels in the first column and the sub-pixels in the second column. It can be seen that the number of data lines may be reduced in this arrangement manner of the sub-pixels, so that a metal layer where the data lines are arranged has more space for wiring.

Figure 3:
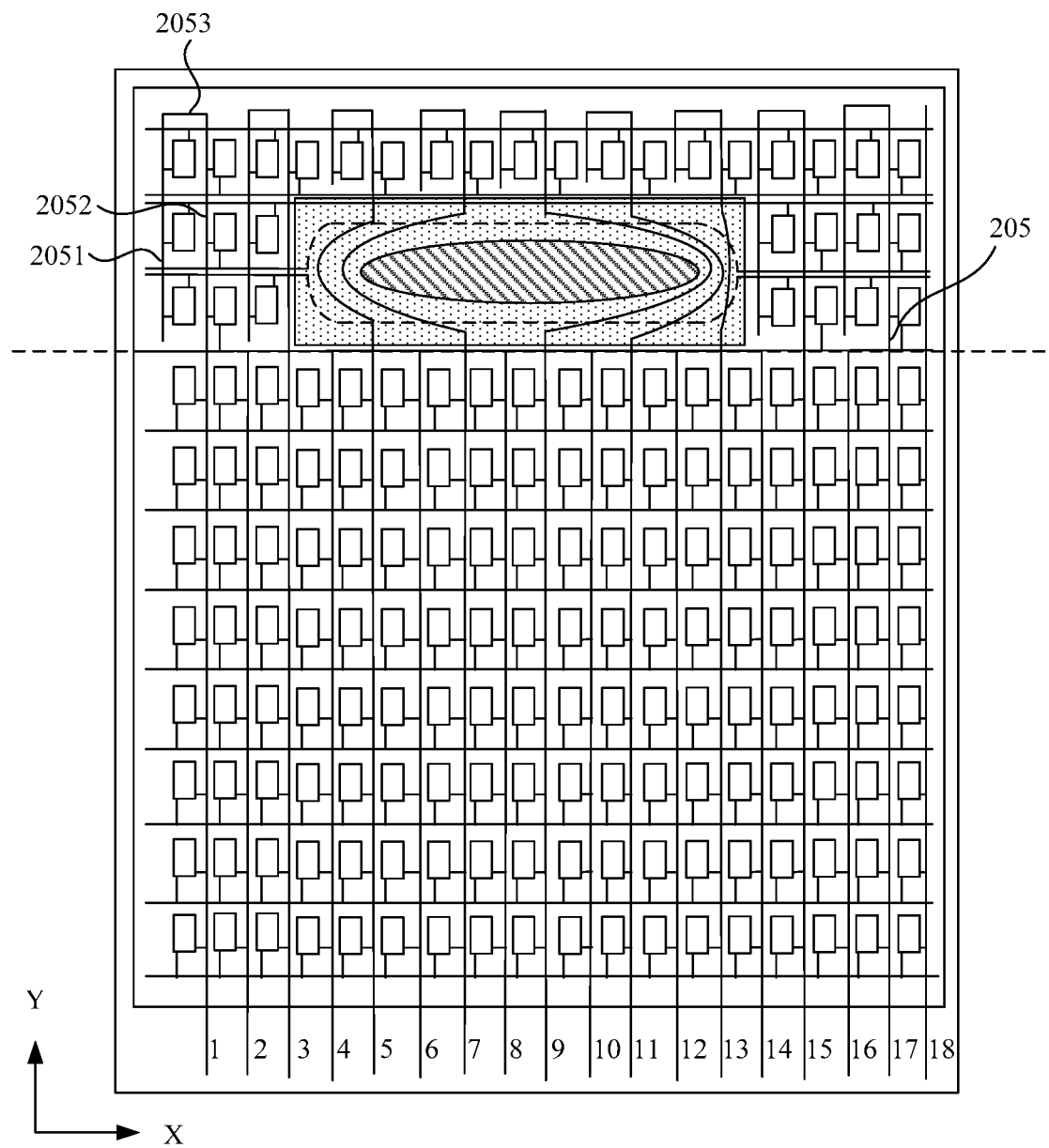
FIG. 3 is another schematic structural diagram of an array substrate according to an embodiment of the present disclosure.

In addition, also as shown in FIG. 3, the first data line 205 includes a first sub-data line 2051, a second sub-data line 2052 and a bending lead line 2053. Among the sub-pixels in two columns connected to the same first data line 205, the sub-pixels in one column form a first sub-pixel column, and the sub-pixels in the other column form a second sub-pixel column.

The first sub-data line is arranged on a side of the first sub-pixel column away from the second sub-pixel column, and the second sub-data line is arranged on a side of the first sub-pixel column close to the second sub-pixel column. The first sub-data line is electrically connected to the second sub-data line through the bending lead line.

For example, in FIG. 3, the sub-pixels in the first column form a first sub-pixel column and the sub-pixels in the second column form a second sub-pixel column. In this case, in this embodiment, the first sub-data line 2051 is arranged on one side of the first sub-pixel column, for example, on a left side of the first sub-pixel column, and the second sub-data line 2052 is arranged on a left side of the second sub-pixel column. Also, the first sub-data line 2051 and the second sub-data line 2052 are connected through the bending lead line 2053. It should be noted that, in this embodiment, the bending lead line 2053 may be arranged at the top of the first sub-data line 2051 and the second sub-data line 2052 shown in FIG. 3. In practice, the bending lead line 2053 may also be arranged between two adjacent sub-pixels in the second row, as long as the first sub-data line 2051 is electrically connected to the second sub-data line 2052 through the bending lead line 2053. In this arrangement manner of sub-pixels, the data lines may be uniformly distributed on the entire display panel, and the bending lead line is arranged at a specific position (such as at the top of the data lines in the display area), which facilitates unified wiring.

Figure 4:
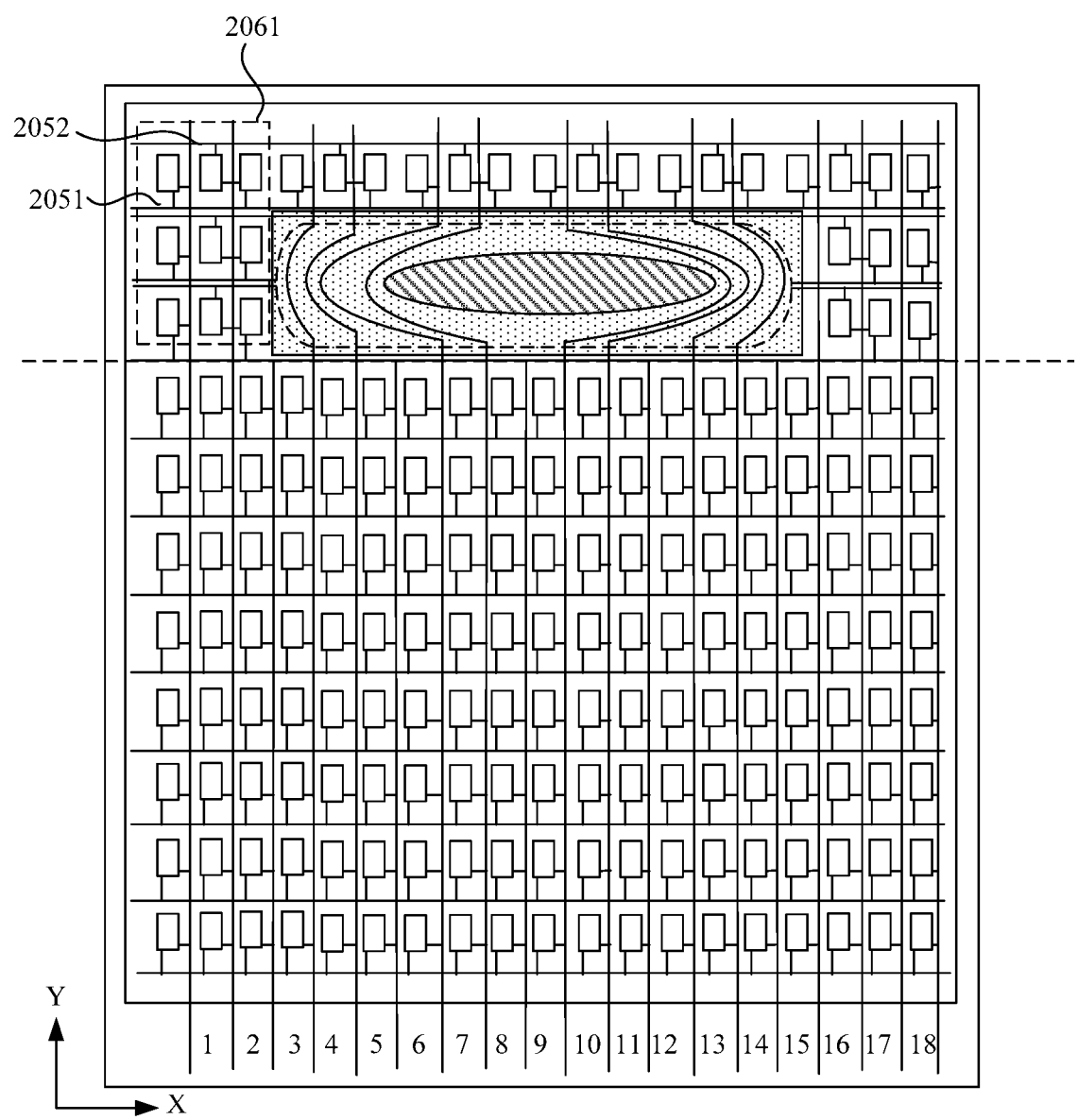
FIG. 4 is another schematic structural diagram of an array substrate according to an embodiment of the present disclosure.

On the basis of the above embodiments, an array substrate is further provided in this embodiment. As shown in FIG. 4, in the array substrate, the sub-pixels in m adjacent columns form a sub-pixel unit column 2061. In the sub-pixel unit column 2061, the sub-pixels in at least two adjacent columns are electrically connected to different first data lines in a case of being electrically connected to the same first gate line, and the sub-pixels in at least two adjacent columns are electrically connected to the same first data line in a case of being electrically connected to different second gate lines, where m is greater than or equal to 3.

For example, in FIG. 4, the sub-pixels in three columns form one sub-pixel unit column 2061. In the sub-pixel unit column, the sub-pixels in a first column is connected to the first data line 1, and the sub-pixels in a third column is connected to the first data line 2, and the sub-pixels in the first column and the sub-pixels in the third column are both connected to the first gate line 2051. The sub-pixels in a second column and the sub-pixels in a third column are connected to the same first data line 2, and the sub-pixels in the second column is connected to the second gate line 2052, and the sub-pixels in the third column are connected to the first gate line 2051. As compared with the conventional technology, the number of data lines used in the first display area may be reduced in this embodiment, that is, the number of the data lines passing through the wiring area is reduced, thereby reducing the occupation area of the data lines bypassing the opening area to pass through the wiring area.

In addition, the position of the gate line in the array substrate is also defined in this embodiment. For example, as a structure shown in FIG. 4, the first gate line electrically connected to the sub-pixels arranged in the same row is arranged on one side of the sub-pixels in the row, and the second gate line electrically connected to the sub-pixels arranged in the same row is arranged on the other side of the sub-pixels in the row.

In practice, the gate line may also be arranged as follows. The first gate line and the second gate line electrically connected to the sub-pixels arranged in the same row are both arranged on the same side of sub-pixels in the row.

It should be illustrated that, regardless of the position of the gate line, it is only necessary to ensure that the sub-pixels in two columns connected to the same data line are not charged simultaneously.

In one embodiment, referring to FIG. 2, in displaying of the display panel, the first gate line 2041 connected to the sub-pixels in the first row is first charged to gate a thin film transistor in the sub-pixels in the first row, and the sub-pixels with a first color are simultaneously charged through the data lines, and then the sub-pixels with a second color and the sub-pixels with a third color are sequentially charged through the data lines. Since the same data line is shared between the sub-pixels in two adjacent columns in the first display area in this embodiment, only a part of the sub-pixels in the first row are charged in the above charging process. Therefore, after the above charging is completed, the second gate line 2042 connected to the sub-pixels in the first row is charged to gate a thin film transistor in the sub-pixels in the first row, and other sub-pixels with the first color arranged in the first row are charged through the data lines, and then the other sub-pixels with the second color and the other sub-pixels with the third color arranged in the first row are sequentially charged through the data lines, so as to complete charging for all of the sub-pixels in the first row.

Subsequently, the above charging process is performed row by row to charge the sub-pixels in remaining rows in the first display area.

It should be noted that the charging process of the sub-pixels arranged in the second display area in this embodiment is different from the charging process of the sub-pixels in the first display area, which is described as follows.

The gate line connected to the sub-pixels arranged in a first row in the second display area is charged to gate a thin film transistor in the sub-pixels in the first row, and the sub-pixels with the first color are simultaneously charged through the data lines, the sub-pixels with the second color and the sub-pixels with the third color are sequentially charged through the data lines, so as to complete charging for the sub-pixels in the first row. Subsequently, the above charging process is performed row by row, to realize charging for the sub-pixels in the remaining rows in the second display area.

Referring to FIG. 2 to FIG. 4, the data line and the gate line in the wiring area are respectively defined as a data lead line and a gate lead line in the embodiment. Therefore, for the data line and the gate line passing through the wiring area, a part of the data line outside of the wiring area is electrically connected to the data lead line, and a part of the gate line outside of the wiring area is electrically connected to the gate lead line. In one embodiment, the first data line is electrically connected to the second data line through the data lead line, and the multiple gate lead lines are connected to the multiple gate lines in a one-to-one correspondence manner.

Figure 5:
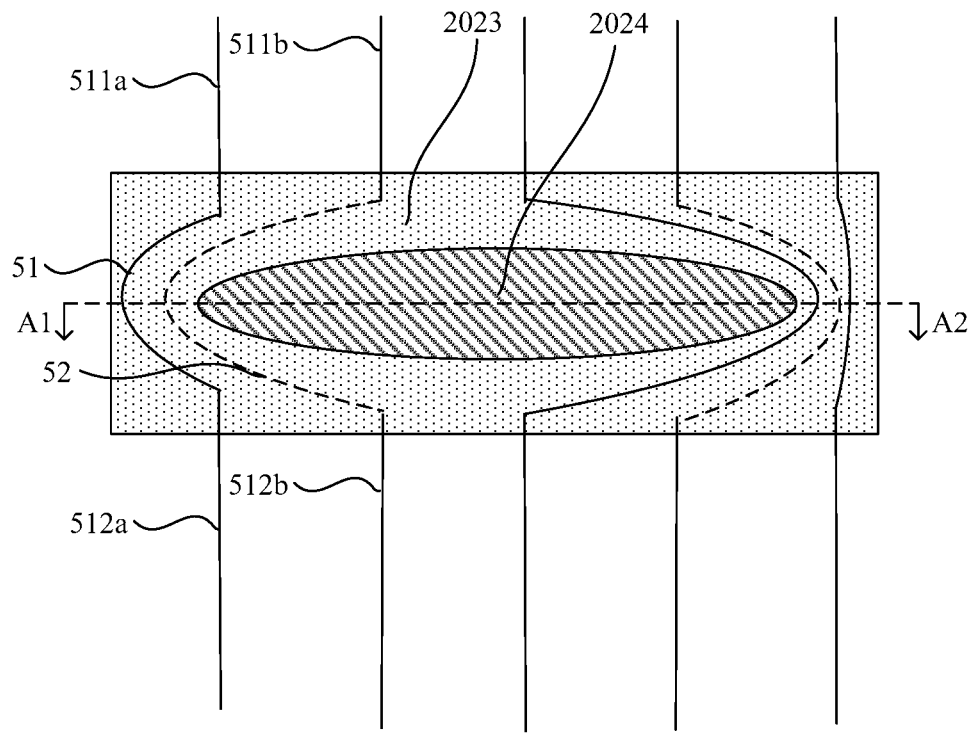
FIG. 5 is a schematic structural diagram of another wiring area according to an embodiment of the present disclosure.
Figure 6:
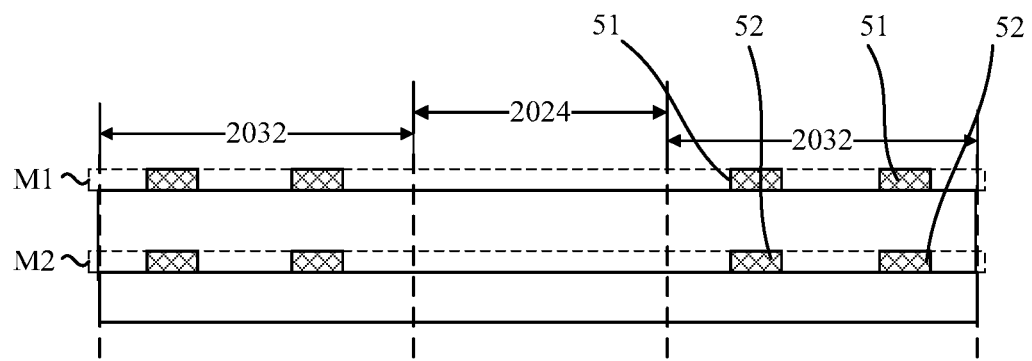
FIG. 6 is a schematic diagram showing a cross section of the wiring area shown in FIG. 5 taken along A1A2.

It should be noted that, in order to further reduce a distance between the opening area and the display area, in connection with FIG. 5 and FIG. 6, in which, FIG. 5 is a schematic structural diagram of another wiring area according to the embodiment, and FIG. 6 is a schematic diagram showing a cross-section of the wiring area shown FIG. 5 taken along a direction of A1A2, the multiple data lead lines may be arranged as a first data lead line 51 and a second data lead line 52 which are insulatively arranged in different layers in this embodiment. In this case, the first data lead line 51 is electrically connected to one first data line 511a and one second data line 512a, and the second data lead line 52 is electrically connected to another first data line 511b and another second data line 512b.

That is, the data lead lines originally arranged in the same layer are arranged in different layers, to reduce a horizontal width of the wiring area occupied by the data lead lines. In addition, in a case that projection of the first data lead line on the array substrate at least partially overlaps projection of the second data lead line on the array substrate, the width of a bezel between the opening area and the first display area may be further reduced. In a case that the projection of the first data lead line on the array substrate completely overlaps the projection of the second data lead line on the array substrate, the width of the bezel between the opening area and the first display area may be halved. In one embodiment, it is assumed that the line distance between adjacent data lead lines is fixed to be p, and if the wiring area includes q data lead lines, the width of the wiring area is at least equal to p×q. In a case that the q data lead lines are evenly arranged in two layers, the width of the wiring area is equal to p×q/2.

Similarly, in this embodiment, the gate lead lines arranged in the wiring area may also be arranged in multiple layers. For example, the gate lead lines include a first gate lead line and a second gate lead line which are insulatively arranged in the same layer. The first gate lead line is electrically connected to the first gate line, and the second gate lead line is electrically connected to the second gate line. It should be illustrated that, since an extension direction of the gate line is perpendicular to an extension direction of the data line, the gate lead line and the data lead line are possibly respectively arranged on different metal layers in the present solution, so that the gate lead line is insulated from the data lead line.

In addition, a color of a sub-pixel in the sub-pixel unit column in the array substrate is further defined in the embodiment. For example, the sub-pixel unit column includes multiple pixel units, and each of the pixel units includes a red sub-pixel, a green sub-pixel, a blue sub-pixel and a white sub-pixel. The sub-pixels with different colors may be arranged in other manner, which is not limited herein.

Based on the same inventive concept, a gate driving circuit applied to the array substrate described above is further provided according to an embodiment of the present disclosure. In one embodiment, the embodiment is described simply with taking three driving manners as an example.

Figure 7:
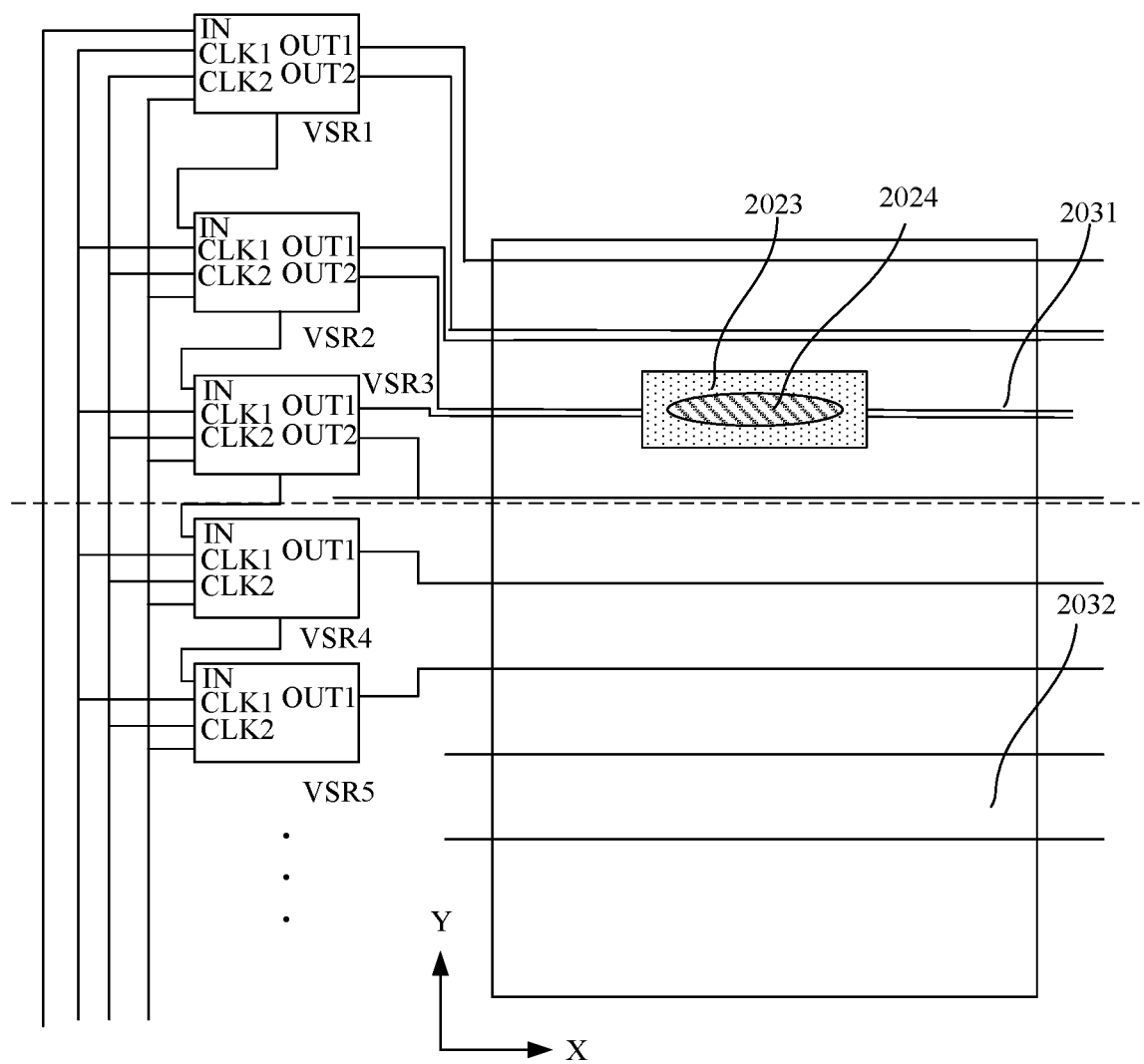
FIG. 7 is a schematic structural diagram of a gate driving circuit according to an embodiment of the present disclosure.

As shown in FIG. 7, the first type of gate driving circuit includes multiple cascaded first gate driving circuits (VSR1, VSR2, and VSR3) and multiple cascaded second gate driving circuits (VSR4 to VSRn).

Each of the first gate driving circuits (VSR1, VSR2, and VSR3) includes at least two gate signal output terminals (OUT1 and OUT2). One gate signal output terminal OUT1 of each of the gate driving circuits is connected to one first gate line arranged in the first display area, and the other gate signal output terminal OUT2 is connected to one second gate line arranged in the first display area. It is assumed that the thin film transistor in the sub-pixel is a high-level gating device. In displaying, in the same first gate driving circuit, the gate signal output terminal OUT1 outputs a high level to gate the thin film transistor included in the sub-pixel connected to the first gate line, while the other gate signal output terminal OUT2 does not output a control signal. After the charging for the sub-pixel connected to the first gate line is completed, the gate signal output terminal OUT2 of the first gate driving circuit outputs a high level to gate the thin film transistor included in the sub-pixel connected to the second gate line, for charging the sub-pixels connected to the second gate line.

The second gate driving circuit (VSR4 to VSRn) includes a gate signal output terminal OUT1, The gate signal output terminal OUT1 is connected to one of the gate lines arranged in the second display area.

It should be noted that, in this embodiment, among the sub-pixels in two columns connected to the same data line, the sub-pixel in one column is connected to the first gate line, and the sub-pixel in the other column is connected to the second gate line. Therefore, in order to ensure normal display, the first gate line and the second gate line are controlled not to simultaneously output the gate signals for gating the thin film transistor. In addition, the number of gate driving circuits in the first display area depends on the number of gate lines in the first display area.

In this embodiment, the first gate driving circuit is provided with multiple output terminals, to correspond to the gate line groups in the first display area without additionally increasing the number of gate driving circuits.

Figure 8:
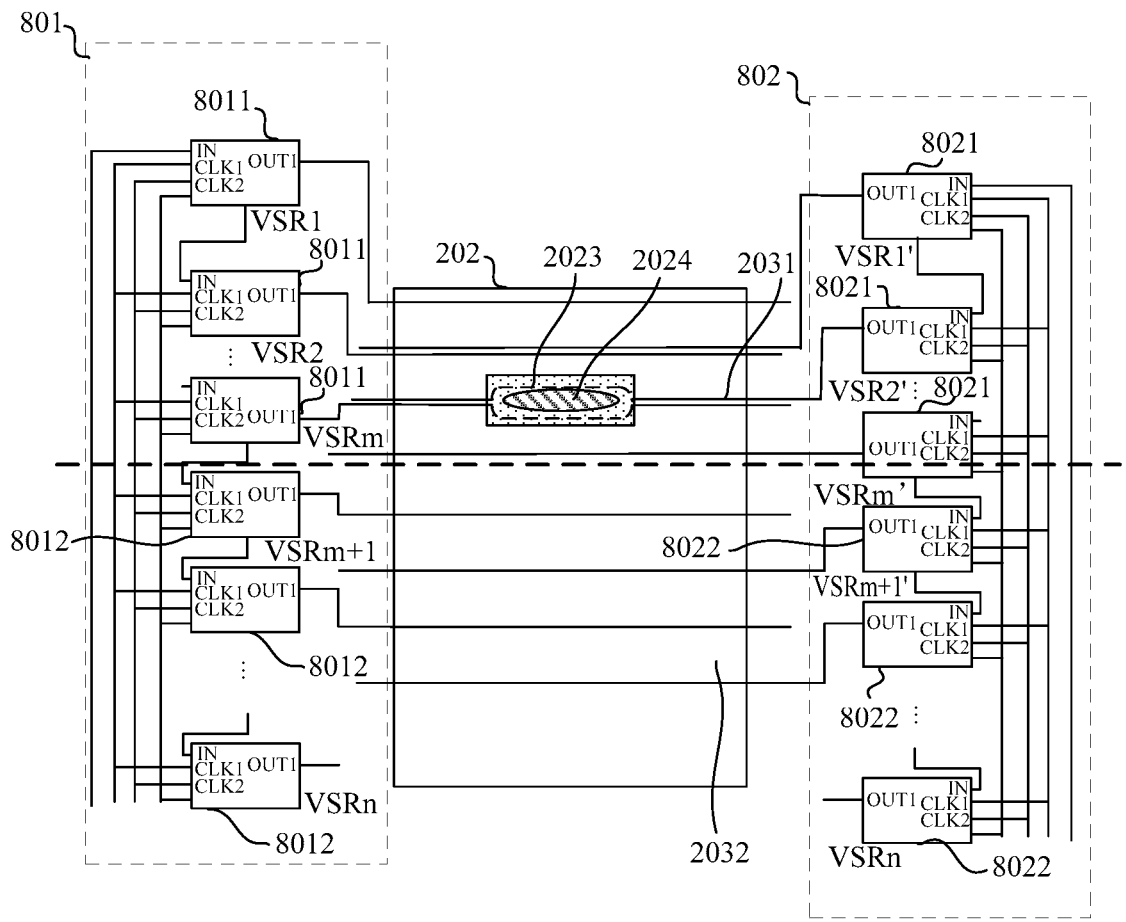
FIG. 8 is another schematic structural diagram of a gate driving circuit according to an embodiment of the present disclosure.

As shown in FIG. 8, the second type of gate driving circuit includes a first gate driving circuit group 801 on one side of the display area 202 and a second gate driving circuit group 802 on the other side of the display area. The first gate driving circuit group 801 includes multiple cascaded third gate driving circuits 8011 and multiple cascaded fourth gate driving circuits 8012, and the second gate driving circuit group 802 includes multiple cascaded fifth gate driving circuits 8021 and multiple cascaded sixth gate driving circuits 8022.

Each of the third gate driving circuits 8011 and the fourth gate driving circuits 8012 includes a gate signal output terminal OUT1. Each of the gate signal output terminals of the third gate driving circuits 8011 is connected to one of the first gate lines arranged in the first display area 2031, and the gate signal output terminals of the multiple fourth gate driving circuits 8012 are connected to a part of the gate lines arranged in the second display area 2032.

Each of the fifth gate driving circuits 8021 and the sixth gate driving circuits 8022 includes a gate signal output terminal OUT1. Each of the gate signal output terminals of the fifth gate driving circuits 8021 is connected to one of the second gate lines arranged in the first display area 2031, and the gate signal output terminals OUT1 of the sixth gate driving circuits 8022 are connected to a part of the gate lines arranged in the second display area 2032.

It should be noted that, in this embodiment, the gate driving circuits connected to the gate lines arranged in the second display area may be arranged in any manner. For example, the gate driving circuits arranged on the right side are configured to control gate lines in odd rows, and the gate driving circuits arranged on the left side are configured to control gate lines in even rows. In one embodiment, the gate driving circuits on the right side are configured to control the gate lines arranged in any row of the second display area, and the gate driving circuits on the left side are configured to control the remaining gate lines.

It is noted that in this embodiment, for the gate line arranged in the wiring area, the first gate line arranged on the left side in the first display area is connected to the first gate line arranged on the right side in the first display area through the gate lead line, that is, crossover line design for the gate lines in the wiring area may be necessary.

In this embodiment, the gate driving circuits are uniformly arranged on both sides of the display panel, to decrease the occupation area of the non-display area surrounding the display area and reduce the width of the bezel.

Figure 9:
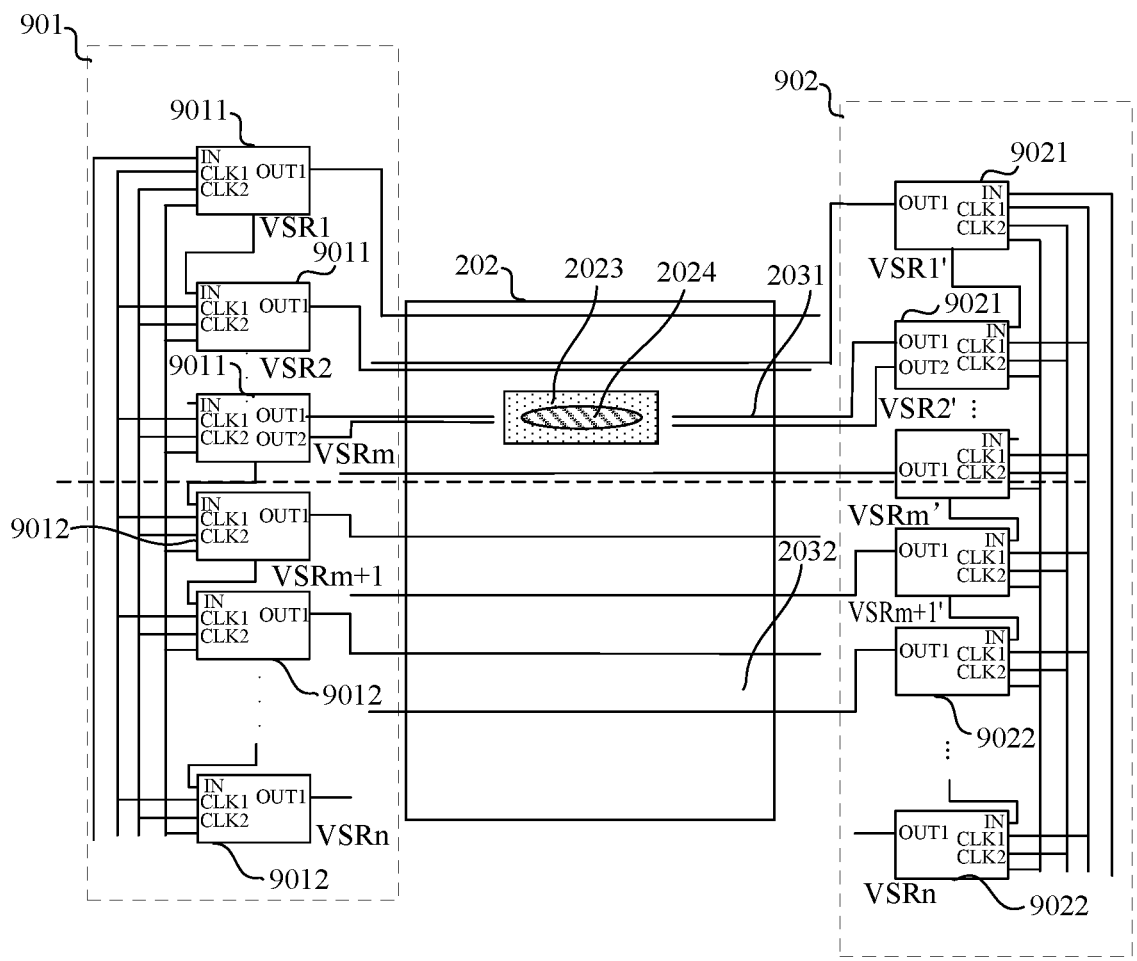
FIG. 9 is another schematic structural diagram of a gate driving circuit according to an embodiment of the present disclosure.

As shown in FIG. 9, a third type of gate driving circuit includes a third gate driving circuit group 901 arranged on one side of the display area 202 and a fourth gate driving circuit group 902 arranged on the other side of the display area. The third gate driving circuit group 901 includes multiple cascaded seventh gate driving circuits 9011, and the fourth gate driving circuit group 902 includes multiple cascaded eighth gate driving circuits 9021.

Among the sub-pixels arranged in the same row of the first display area 2031, the gate line connected to the sub-pixel arranged on one side of the opening area is connected to an output terminal of the seventh gate driving circuit 9011, and the gate line connected to the sub-pixel arranged on the other side of the opening area is connected to an output terminal of the eighth gate driving circuit 9021.

A difference of this embodiment from the gate driving circuit shown in FIG. 8 is that in this embodiment, for the gate line arranged in the wiring area, it may not be necessary to connect the first gate line arranged on the left side of the first display area with the first gate line arranged on the right side of the first display area through the gate lead line, that is, crossover design for the gate lines in the wiring area may not be necessary, thereby simplifying wiring. The gate lines arranged on the left side of the wiring area and the gate lines arranged on the right side of the wiring area are respectively driven by the gate driving circuit arranged on the left side of the display area and the gate driving circuit arranged on the right side of the display area.

It should be illustrated that, a connection manner of the gate line arranged in the first display area and the gate driving circuit without the crossover line design is not limited in this embodiment. For example, as shown FIG. 9, the gate driving circuit VSR2 is connected to the second gate line, and the gate driving circuit VSR2' is connected to the first gate line. In one embodiment, the gate signal output terminal OUT1 of the gate driving circuit VSRm is connected to the first gate line, the gate signal output terminal OUT2 of the gate driving circuit VSRm is connected to the second gate line, and so forth.

Figure 10:
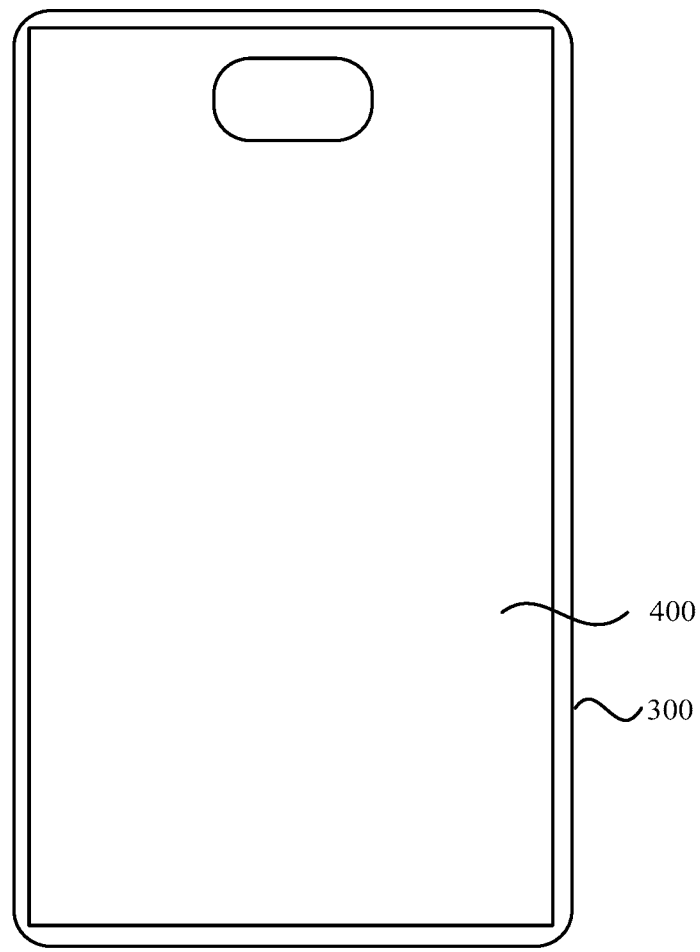
FIG. 10 is a schematic structural diagram of a display panel according to an embodiment of the present disclosure.

Based on the same inventive concept, a display panel is further provided according to an embodiment of the present disclosure. FIG. 10 is a schematic structural diagram of a display panel according to an embodiment of the present disclosure. Referring to FIG. 10, the display panel 300 includes any one of the array substrates 400 according to the embodiments of the present disclosure. The display panel 300 may be applied to an electronic device such as a mobile phone, a tablet computer, and a smart wearable device.

Since the display panel 300 according to the embodiment of the present disclosure includes any one of the array substrates 400 according to the embodiments of the present disclosure, the display panel 300 has the beneficial effects corresponding to the array substrate 400 included therein, which are not described herein again.

In general, an array substrate according to the present disclosure includes a display area and a non-display area. The display area includes a first display area and a second display area, and the non-display area includes a first non-display area and a second non-display area. The first non-display area surrounds the display area, and the second non-display area includes a wiring area and an opening area. The first display area surrounds the opening area. Multiple gate line groups and multiple first data lines are arranged in the first display area. Each of the gate line groups includes a first gate line and a second gate line. The multiple gate line groups intersect with the first data lines to define multiple sub-pixels arranged in an array. The sub-pixels in at least two adjacent columns are connected to the same first data line. Among two sub-pixels in the same row electrically connected to the same first data line, one sub-pixel is connected to the first gate line, and the other sub-pixel is connected to the second gate line. Multiple gate lines and multiple second data lines are arranged in the second display area. The multiple gate lines intersect with the second data lines to define multiple sub-pixels arranged in an array. The sub-pixels in the same column are connected to the same second data line, and the sub-pixels in different columns are connected to different second data lines. The sub-pixels in the same row are all connected to the same gate line, and the sub-pixels in different rows are connected to different gate lines.

It can be seen that, in this solution, the sub-pixels in the first display area which surrounds the opening area are connected to two gate lines, which reduces the number of the used first data lines, and reduces the number of lines bypassing the opening area, thereby decreasing the width of the bezel between the opening area and the first display area.

In addition, since the number of data lines in the first display area is reduced, the number of the data lines bypassing the opening area and arranged in the wiring area is reduced, and a line distance between two adjacent data lines can be increased, thereby reducing the coupling capacitance between the two adjacent data lines.

The invention claimed is:

1. An array substrate, comprising:
   a display area and a non-display area, wherein the display area comprises a first display area and a second display area, the non-display area comprises a first non-display area and a second non-display area, wherein the display area is surrounded by the first non-display area, the second non-display area comprises an opening area, and the opening area is surrounded by the first display area;
   a plurality of gate line groups and a plurality of first data lines arranged in the first display area, wherein each of the gate line groups comprises a first gate line and a second gate line, and the plurality of gate line groups intersect with the first data lines to define a plurality of sub-pixels arranged in an array, and the sub-pixels in at least two adjacent columns are connected to a same first data line, and among the two sub-pixels in a same row electrically connected to the same first data line, one sub-pixel is connected to the first gate line, and the other sub-pixel is connected to the second gate line; and
   a plurality of gate lines and a plurality of second data lines arranged in the second display area, wherein the plurality of gate lines intersect with the second data lines to define a plurality of sub-pixels arranged in an array, the sub-pixels in a same column are connected to a same second data line, and the sub-pixels in different columns are connected to different second data lines, and the sub-pixels in a same row are connected to a same gate line, and the sub-pixels in different rows are connected to different gate lines.

2. The array substrate according to claim 1, wherein among the sub-pixels arranged in the first display area,
   the sub-pixels in an odd column and the sub-pixels in an even column adjacent to the odd column are connected to a same first data line, and the sub-pixels in different odd columns are respectively connected to different first data lines; and
   among the sub-pixels in the same row, the sub-pixels arranged in an odd column are connected to the first gate line, and the sub-pixels arranged in an even column are connected to the second gate line.

3. The array substrate according to claim 1, wherein among the sub-pixels in two columns connected to the same first data line, the sub-pixels in one column are arranged on one side of the first data line, and the sub-pixels in the other column are arranged on the other side of the first data line.

4. The array substrate according to claim 1, wherein
   each of the first data lines comprises a first sub-data line, a bending lead line and a second sub-data line,
   among the sub-pixels in two columns connected to the same first data line, the sub-pixels in one column form a first sub-pixel column, and the sub-pixels in the other column form a second sub-pixel column; and
   the first sub-data line is arranged on a side of the first sub-pixel column away from the second sub-pixel column, the second sub-data line is arranged on a side of the first sub-pixel column close to the second sub-pixel column, and the first sub-data line is electrically connected to the second sub-data line through the bending lead line.

5. The array substrate according to claim 1, wherein
   the sub-pixels in m adjacent columns form a sub-pixel unit column, and
   in the sub-pixel unit column, the sub-pixels in at least two adjacent columns are electrically connected to different first data lines in a case of being electrically connected to a same first gate line, and the sub-pixels in at least two adjacent columns are electrically connected to a same first data line in a case of being electrically connected to different second gate lines, wherein m is a positive integer greater than or equal to 3.

6. The array substrate according to claim 1, wherein the first gate line electrically connected to the sub-pixels arranged in the same row is arranged on one side of the sub-pixels in the row, and the second gate line electrically connected to the sub-pixels arranged in the same row is arranged on the other side of the sub-pixels in the row.

7. The array substrate according to claim 1, wherein each of the first gate line and the second gate line electrically connected to the sub-pixels arranged in the same row is arranged on a same side of the sub-pixels in the row.

8. The array substrate according to claim 1, wherein
the non-display area comprises the opening area and a wiring area; and
the wiring area is arranged between the display area and the opening area, and the wiring area is surrounded by the display area, a plurality of data lead lines and a plurality of gate lead lines are arranged in the wiring area, the first data line is electrically connected to the second data line through the data line lead, and the plurality of the gate lead lines are connected with the plurality of the gate lines in a one-to-one correspondence manner.

9. The array substrate according to claim 8, wherein
the plurality of data lead lines comprise a first data lead line and a second data lead line insulatively arranged in different layers, and
the first data lead line is electrically connected to one first data line and one second data line, and the second data lead line is electrically connected to another first data line and another second data line.

10. The array substrate according to claim 9, wherein projection of the first data lead line on the array substrate at least partially overlaps projection of the second data lead line on the array substrate.

11. The array substrate according to claim 8, wherein
the gate lead line comprises a first gate lead line and a second gate lead line insulatively arranged in the same layer; and
the first gate lead line is electrically connected to the first gate line, and the second gate lead line is electrically connected to the second gate line.

12. The array substrate according to claim 5, wherein the sub-pixel unit column comprises a plurality of pixel units, and each of the pixel units comprises a red sub-pixel, a green sub-pixel and a blue sub-pixel.

13. The array substrate according to claim 12, wherein each of the pixel units further comprises a white sub-pixel.

14. A gate driving circuit applied to the array substrate according to claim 1, the gate driving circuit comprising:
a plurality of cascaded first gate driving circuits; and
a plurality of cascaded second gate driving circuits,
wherein each of the first gate driving circuits comprises at least two gate signal output terminals, and in each of the first gate driving circuits, one of the gate signal output terminals is connected to one of the first gate lines arranged in the first display area, and the other of the gate signal output terminals is connected to one of the second gate lines arranged in the first display area; and
each of the second gate driving circuits comprises a gate signal output terminal, and the gate signal output terminal is connected to one of the gate lines arranged in the second display area.

15. A gate driving circuit applied to the array substrate according to claim 1, the gate driving circuit comprising:
a first gate driving circuit group arranged on one side of the display area; and
a second gate driving circuit group arranged on the other side of the display area,
wherein the first gate driving circuit group comprises a plurality of cascaded third gate driving circuits and a plurality of cascaded fourth gate driving circuits, the second gate driving circuit group comprises a plurality of cascaded fifth gate driving circuits and a plurality of cascaded sixth gate driving circuits,
each of the third gate driving circuits and the fourth gate driving circuits comprises a gate signal output terminal, and the gate signal output terminal of each of the third gate driving circuits is connected to one of the first gate lines arranged in the first display area, the gate signal output terminals of the fourth gate driving circuits are connected to a part of the gate lines arranged in the second display area; and
each of the fifth gate driving circuits and the sixth gate driving circuits comprises a gate signal output terminal, the gate signal output terminal of each of the fifth gate driving circuits is connected to one of the second gate lines arranged in the first display area, and the gate signal output terminals of the sixth gate driving circuits are connected to a part of the gate lines arranged in the second display area.

16. A gate driving circuit applied to the array substrate according to claim 1, the gate driving circuit comprising:
a third gate driving circuit group on one side of the display area; and
a fourth gate driving circuit group on the other side of the display area,
wherein the third gate driving circuit group comprises a plurality of cascaded seventh gate driving circuits, and the fourth gate driving circuit group comprises a plurality of cascaded eighth gate driving circuits, and
among the sub-pixels arranged in the same row of the first display area, the gate line connected to the sub-pixel arranged on one side of the opening area is connected to an output terminal of the seventh gate driving circuit, and the gate line connected to the sub-pixel arranged on the other side of the opening area is connected to an output terminal of the eighth gate driving circuit.

17. A display panel comprising:
an array substrate, wherein the array substrate comprises:
a display area and a non-display area, wherein the display area comprises a first display area and a second display area, the non-display area comprises a first non-display area and a second non-display area, wherein the display area is surrounded by the first non-display area, the second non-display area comprises an opening area, and the opening area is surrounded by the first display area;
a plurality of gate line groups and a plurality of first data lines arranged in the first display area, wherein each of the gate line groups comprises a first gate line and a second gate line, and the plurality of gate line groups intersect with the first data lines to define a plurality of sub-pixels arranged in an array, and the sub-pixels in at least two adjacent columns are connected to a same first data line, and among the two sub-pixels in a same row electrically connected to the same first data line, one sub-pixel is connected to the first gate line, and the other sub-pixel is connected to the second gate line; and
a plurality of gate lines and a plurality of second data lines arranged in the second display area, wherein the plurality of gate lines intersect with the second data lines to define a plurality of sub-pixels arranged in an array, the sub-pixels in a same column are connected to a same second data line, and the sub-pixels in different columns are connected to different second data lines, and the sub-pixels in a same row are connected to a same gate line, and the sub-pixels in different rows are connected to different gate lines.

* * * * *